United States Patent
Grieshaber et al.

(10) Patent No.: US 8,866,486 B2
(45) Date of Patent: Oct. 21, 2014

(54) DEVICE FOR DETECTING AND LOCATING ELECTRIC DISCHARGES IN FLUID-INSULATED ELECTRICAL EQUIPMENT

(75) Inventors: Wolfgang Grieshaber, Lyons (FR); Alain Fanget, Tramoyes (FR)

(73) Assignee: Alstom Technology Ltd., Paris (FR)

( * ) Notice: Subject to any disclaimer, the term of this patent is extended or adjusted under 35 U.S.C. 154(b) by 667 days.

(21) Appl. No.: 12/745,762

(22) PCT Filed: Dec. 1, 2008

(86) PCT No.: PCT/EP2008/066552
§ 371 (c)(1),
(2), (4) Date: Jun. 2, 2010

(87) PCT Pub. No.: WO2009/071516
PCT Pub. Date: Jun. 11, 2009

(65) Prior Publication Data
US 2010/0259275 A1    Oct. 14, 2010

(30) Foreign Application Priority Data
Dec. 3, 2007    (FR) ...................................... 07 59511

(51) Int. Cl.
*G01R 31/08* (2006.01)
*H01H 33/26* (2006.01)
*G01R 31/12* (2006.01)

(52) U.S. Cl.
CPC ........... *H01H 33/26* (2013.01); *G01R 31/1254* (2013.01)
USPC .......................................... 324/522; 324/536

(58) Field of Classification Search
USPC ......................................... 324/536, 522, 525
See application file for complete search history.

(56) References Cited

U.S. PATENT DOCUMENTS

| | | | |
|---|---|---|---|
| 4,446,420 A | 5/1984 | Drouet | |
| 5,933,012 A * | 8/1999 | Bengtsson et al. | 324/524 |
| 6,295,190 B1 | 9/2001 | Rinaldi et al. | |
| 6,614,218 B1 * | 9/2003 | Ray | 324/117 R |
| 6,844,737 B2 * | 1/2005 | Leprettre et al. | 324/511 |
| 2008/0191705 A1 * | 8/2008 | Bellan | 324/529 |
| 2008/0297162 A1 * | 12/2008 | Bright et al. | 324/512 |
| 2010/0259275 A1 * | 10/2010 | Grieshaber et al. | 324/522 |

FOREIGN PATENT DOCUMENTS

| | | | |
|---|---|---|---|
| DE | 44 45 596 C2 | 6/1996 | |
| DE | 197 58 087 A1 | 7/1999 | |
| JP | 2001218322 A * | 8/2001 | G01R 31/12 |
| KR | 2008024350 A * | 3/2008 | G01R 27/20 |
| WO | WO 2004/051291 A2 | 6/2004 | |

* cited by examiner

*Primary Examiner* — Arleen M Vazquez
*Assistant Examiner* — Brent J Andrews
(74) *Attorney, Agent, or Firm* — Oblon, Spivak, McClelland, Maier & Neustadt, L.L.P.

(57) ABSTRACT

A device for detecting and locating at least one electric discharge in equipment insulated by fluid contained in an electrically-conductive housing. The equipment includes a plurality of grounding lines connected between the housing and ground. The device includes a plurality of Rogowski coil type current detectors and a mechanism synchronously comparing signals delivered by the current detectors. The coil of each detector is placed around a respective one of the lines. Each detector delivers a signal representative of current flowing in the line, with occurrence of an electric discharge giving rise to a sudden variation in the current, and with electric discharge being located within an inside zone of the housing situated in proximity of the line that is surrounded by the detector that was first to deliver the sudden variation of current.

17 Claims, 3 Drawing Sheets

DEVICE FOR DETECTING AND LOCATING ELECTRIC DISCHARGES IN FLUID-INSULATED ELECTRICAL EQUIPMENT

TECHNICAL FIELD

The present invention relates to a device for detecting and locating at least one electric discharge in fluid-insulated electrical equipment.

By way of example, the fluid-insulated electrical equipment in question may be constituted by a metal-housing high voltage electrical unit of the kind known as gas-insulated switchgear (GIS). It is possible to consider that the fluid-insulated electrical equipment is a transformer located in a tank filled with a dielectric liquid, or a segment of a set of gas-insulated bars.

Metal-housing units or gas-insulated switchgear comprise tight electrically-conductive housing containing at least one conductor element that is raised to a high voltage. The housing is filled with an insulating gas such as sulfur hexafluoride. The housing is connected to ground potential in order to ensure safety for personnel working in the vicinity of such electrical equipment. For this purpose, at least one grounding line connects the housing to ground. Generally, the housing is in the form of a succession of compartments connected together end to end by means of flanges, and a plurality of grounding lines are used, each line being connected in the vicinity of the flanges between two adjacent compartments. By way of example, the conductor element may be a bar, or it may comprise the contacts of switchgear such as a disconnector or a circuit breaker. Such conductor elements are held substantially in the central portion of the housing with the help of centering cones of dielectric material.

Dielectric material cones can be inserted between two successive housing segments.

This electric discharge may be a partial discharge, a corona effect discharge, a non-maintained disruptive discharge, or some other kind of discharge.

A corona effect electric discharge is an electric discharge due to the medium surrounding a conductor being ionized.

A partial discharge (PD) can be a dielectric leakage located within an electrically-insulating part under the effect of a strong electric field. A partial discharge may generally appear in the insulating part or in the proximity thereof due to imperfections such as voids, inclusions, or inhomogeneities. When high voltage is applied, small discharges occur in the imperfections, but the remainder of the insulating part suffices to withstand the applied voltage. Nevertheless, if the electric field is relatively strong, these small discharges can wear away the insulating material and degenerate into a complete strike after several months or several years of operation. A partial discharge is a phenomenon that is intermittent, and usually invisible to the eye.

STATE OF THE PRIOR ART

In order to protect electrical equipment of that type, attempts are made to detect and locate electric discharges in order to eliminate the source thereof, since such discharges run the risk of damaging the electrical equipment in the shorter or longer term. If partial discharges lead to a total strike they can give rise to the electrical equipment being damaged totally.

Such partial discharges are of the order of a few picocoulombs. Electric discharges and more particularly partial discharges can be detected by placing sensors inside the housing.

Such sensors may be acoustic sensors, capacitive sensors, or current sensors, e.g. Rogowski coil type sensors as described in U.S. Pat. No. 4,446,420. The drawback with those methods is that the sensors need to be provided when the equipment is designed and built. Thus, in the above-mentioned US patent, the Rogowski coils are placed in cavities specially provided at the connections between two successive compartments of the housing of the electrical equipment, which compartments are assembled together end to end.

In other configurations, it is possible to place acoustic type sensors outside the housing, or capacitive type sensors facing an inspection window. The drawback of that configuration is that it is necessary to provide the inspection windows, even though inspection windows are being used less and less in metal-housing high-voltage electrical units.

In other configurations, when different compartments of the metal housing are partitioned by dielectric cones and conductive fixing brackets are used for electrical continuity between two consecutive compartments, with the brackets being bolted to the outsides of the fastening flanges that terminate the two compartments, it is possible to place a partial discharge sensor between the conductive brackets and the dielectric cones. That configuration is becoming less and less applicable, since dielectric cones are no longer used to prevent direct electrical connections being made between fastening flanges terminating two consecutive compartments.

In documents DE 19 758 087 and DE 44 45 596, it is recommended to use Rogowski coils for measuring partial discharges. In the first document, the Rogowski coils are placed on the inlet bushings of the transformer and on the neutral conductor. The neutral conductor may be connected to ground or it may be insulated from ground. When insulated, it is "delivered" to the customer like a live phase. This is determined by the high voltage operator.

In document DE 44 45 596, a cable under test is fed with direct current (DC) and a capacitor is connected in parallel therewith. Two Rogowski coils are placed around a conductor connected to a terminal of the capacitor in order to detect partial discharges in the cable.

In both of the above two circumstances, it is necessary to be able to access the conductor under voltage on its own, i.e. without the conductive housing, and that is not possible in a substation that is in operation. In a metal-housing unit, this can be done only with overhead bushings. For the remainder of the unit, since the metal housing also conducts current, it prevents measuring the current carried by the bar it surrounds. Furthermore, the housing is large in diameter, thereby making it difficult to construct Rogowski coils of such a size.

SUMMARY OF THE INVENTION

A particular object of the present invention is to provide a device for detecting and locating at least one electric discharge in fluid-insulated electrical equipment, which device does not present the above-mentioned drawbacks.

An object of the invention is to provide a device for detecting and locating at least one electric discharge in fluid-insulated electrical equipment of any kind whatsoever, and that need not necessarily have been designed for this kind of detection and locating.

Another object of the invention is to provide a device for detecting and locating at least one electric discharge in fluid-insulated electrical equipment that provides a high level of safety for the operator called on to use the device.

Yet another object of the invention is to be able to detect and locate electric discharges while being little affected by the noise that inevitably exists.

To achieve these objects, the invention proposes using Rogowski coils and placing them outside the housing, around grounding lines that conventionally connect the housing to ground.

More particularly, the present invention relates to a device for detecting and locating at least one electric discharge in electrical equipment insulated by fluid contained in electrically-conductive housing, the electrical equipment being provided with a plurality of grounding lines connected between the housing and ground and distributed along the housing. The device comprises a plurality of current detectors of the Rogowski coil type, the coil of each of the detectors being placed around a respective grounding line, each detector delivering a signal representative of current flowing in said grounding line, the occurrence of an electric discharge giving rise to a sudden variation of the current, and means for synchronously comparing the signals delivered by the current detectors in order to locate the electric discharge within a zone inside the housing and situated in the proximity of the grounding line that is surrounded by the current detector that was the first to deliver the sudden variation representative of the electric discharge.

The coil of a detector may be a coil substantially in the form of a ring that can be opened so as to enable it to be placed around a grounding line without it being necessary to disconnect one of the ends of said grounding line.

In a variant, the coil of a detector may be a coil substantially in the form of a closed ring, the grounding line comprising a main grounding line segment connected to the housing and to ground, and a secondary grounding line segment connected at first and second ends in parallel with the main grounding segment, the detector coil being threaded around the secondary grounding line segment.

The main grounding line segment may be electrically continuous between the first and second ends of the secondary grounding line segment.

In a variant, the main grounding line segment may be electrically discontinuous between the first and second ends of the secondary grounding line segment, in this way, the current detector measures a current of greater intensity that in the preceding variant, thereby enabling discharges of smaller intensity to be detected.

The detection and locating device may further include processor means for processing signals delivered by the current detectors in order to distinguish the type of electric discharge from amongst a partial discharge, a corona effect discharge, and a non-maintained disruptive discharge.

The signals delivered by the current detectors may be integrated. For a Rogowski sensor in which the output signal is proportional to the time derivative of the current, integration makes it possible to obtain the current.

The present invention also provides fluid-insulated electrical equipment, that includes a device as characterized above for detecting and locating at least one electric discharge.

By way of example, the electrical equipment may be a metal-housing high-voltage electrical unit or it may be gas-insulated switchgear or controlgear.

The present invention also provides a method of detecting and locating at least one electric discharge in electrical equipment insulated by fluid contained in electrically-conductive housing, the electrical equipment being provided with a plurality of grounding lines, connected between the housing and ground, distributed along the housing, in which a plurality of current detectors of the Rogowski coil type are provided, each being placed around a respective grounding line, the signals delivered by each of the current detectors are acquired and compared synchronously, with the occurrence of an electric discharge giving rise to a sudden variation in the current, and an electric discharge is located as being within a zone inside the housing situated in the proximity of the grounding line that is surrounded by the current detector that was the first to deliver the sudden variation representative of the electric discharge.

A Rogowski coil that is substantially in the form of a ring suitable for being opened may be placed around a grounding line.

In a variant, when the grounding line comprises both a main grounding line segment connected to the housing and to ground, and a secondary grounding line segment, the Rogowski coil may be engaged around the secondary grounding line segment, the coil being substantially in the form of a closed ring, and the secondary grounding line segment may be connected at first and second ends in parallel with the main grounding line segment.

The main grounding line segment between the first and second ends of the secondary grounding line segment may be opened.

The signals delivered by a current detector that was the first to deliver a signal representative of an electric discharge may also be analyzed in order to determine the type of the electric discharge that has occurred.

BRIEF DESCRIPTION OF THE DRAWINGS

The present invention can be better understood on reading the following description of embodiments given purely by way of non-limiting indication and with reference to the accompanying drawings, in which.

In the various figures described below, portions that are identical, similar, or equivalent are given the same references so as to make it easier to go from one figure to another.

The various portions shown in the figures are not necessarily all to the same scale, in order to make the figures more legible.

DETAILED DESCRIPTION OF PARTICULAR EMBODIMENTS

Figure 1A:
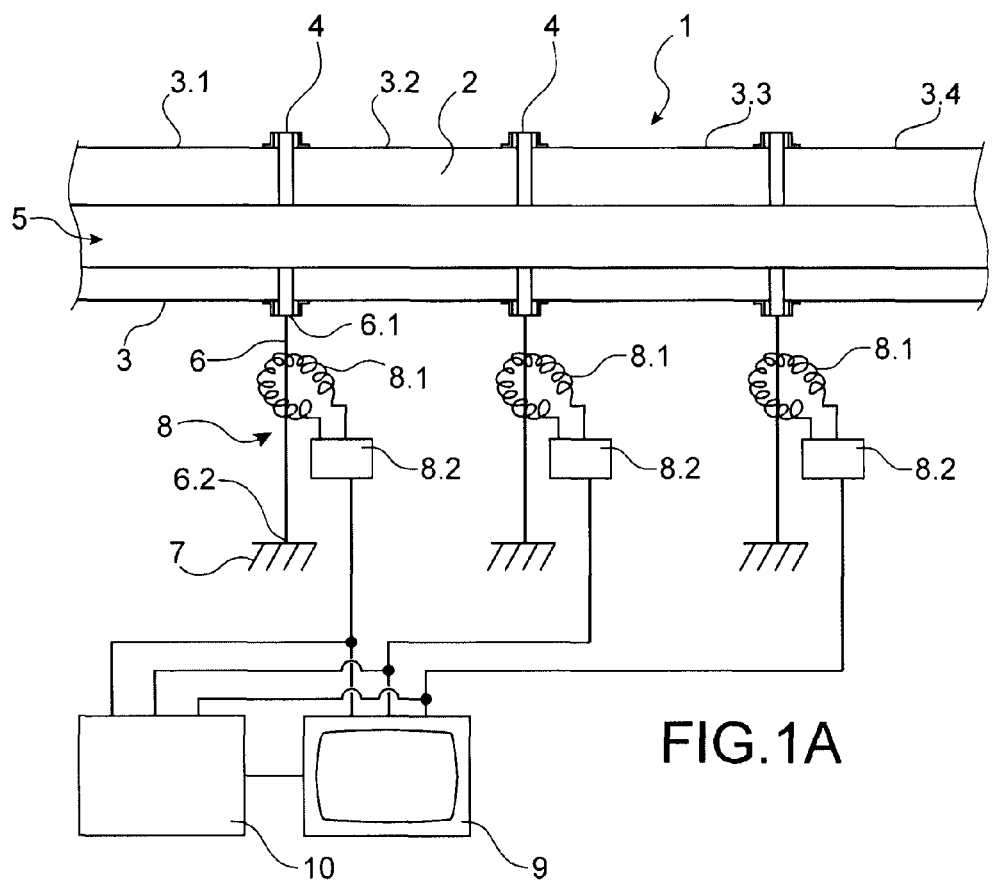
FIG. 1A shows schematically an electrical equipment under conductive housing fitted with a device for detecting and locating at least one electric discharge.

Reference is made to highly diagrammatic FIG. 1A, which shows electrical equipment 1 insulated by fluid 2 contained in electrically-conductive housing 3. In the example described, the electrically-conductive housing 3 is in the form of a tube, and it is made up of a plurality of tubular compartments 3.1, 3.2, 3.3, 3.4 that are assembled to one another, e.g. by flanges 4. The various compartments 3.1, 3.2, 3.3, 3.4 are not necessarily assembled to one another in linear manner. There is no electrical insulation between two successive compartments.

The fluid 2 contained in the housing 3 may be sulfur hexafluoride $SF_6$. An electrical conductor element 5 is immersed therein, which element may have a very variety of forms: it may be a bar, switchgear such as a disconnector or a circuit breaker, a transformer, or else. This electrical conductor elements 5 may be held in place within the housing 3 with the help of dielectric cones (not shown).

The electrical equipment 1 is provided with a plurality of grounding lines 6 that connect the housing electrically to ground 7. These grounding lines 6 extend outside the housing 3 and are therefore accessible to maintenance operators. The grounding lines 6 are distributed substantially regularly along the electrically-conductive housing 3 so as to provide safety for operators. They may be spaced apart for example at intervals of about 10 meters, the housing 3 itself generally being much longer. Some of these grounding lines 6 may be single pieces between one end 6.1 connected to the housing 3 and another end 6.2 connected to ground 7, while on the contrary others may be made up of a plurality of pieces, interconnected by separable connections 6.3, e.g. screw connections. This configuration is visible in FIGS. 3A, 3B, 3C. The grounding lines 6 are designed to carry leakage or induced currents, where such leakage currents flow in particular in the event of electric discharges occurring.

According to the invention, the electrical equipment 1 is fitted with a device 8 located outside the housing 3 and serving to detect and locate at least one electric discharge.

This device for detecting and locating at least one electric discharge comprises a plurality of current detectors 8.1 of the Rogowski coil type. Each Rogowski coil 8.1 is placed around a grounding line 6.

A Rogowski coil is a helical winding, made in air or around a non-magnetic core, and having substantially the shape of a ring. The winding is placed around a conductor in such a manner that the magnetic fields produced by the current carried by the conductor generate a voltage across the terminals of the winding that is proportional to the derivative of the current flowing in the conductor.

The Rogowski coil 8.1 is connected to an electronic shaper circuit 8.2 that delivers a signal substantially proportional to the current flowing in the conductor. The electronic circuit may be of the integrator type, but that is not essential. Since the winding is in air or around a non-magnetic core, it is sensitive solely to variations in the flux carried by the coil and it is not disturbed by magnetic saturation. In FIG. 1A, the Rogowski coils 8.1 are wound in air.

Another advantage of a current sensor of the Rogowski coil type is that its sensitivity increases linearly with increasing frequency of the current to be measured. Such a Rogowski coil is suitable for measuring currents that are very small, providing they are at high frequency, as applies to the current of electric discharges and in particular of partial discharges.

The device for detecting and locating at least one electric discharge also includes comparator means 9 for synchronously comparing the signals delivered by each of the current detectors 8.1.

Analyzing the signals delivered by the various current detectors 8.1 synchronously makes it possible to locate the position where an electric discharge begins. By way of example, the appearance of an electric discharge leads to a sudden variation in the signal delivered by the current detector, the variation being in the form of bursts of pulses.

Figure 1B:
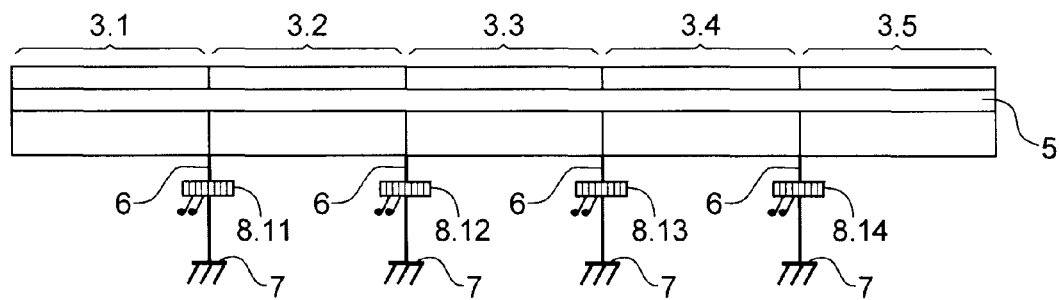
FIG. 1B shows a variant of electrical equipment under conductive housing fitted with a device for detecting and locating at least one electric discharge.
Figure 1C:
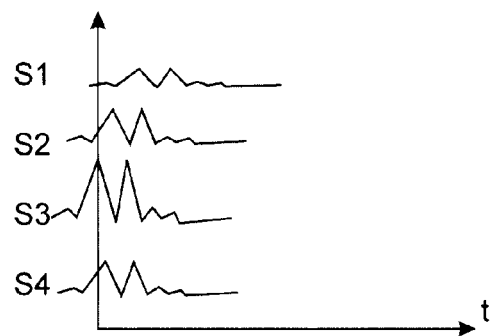
FIG. 1C shows the signals delivered by the current sensors shown in FIG. 1B.

In FIG. 1B, there can be seen in even more diagrammatic manner four current detectors 8.11, 8.12, 8.13, 8.14, each placed around a grounding line 6 of electrical equipment 1 having housing 3 subdivided into five compartments 3.1, 3.2, 3.3, 3.4, 3.5. FIG. 1C shows the signals S1, S2, S3, S4 delivered by each of the four current detectors 8.11, 8.12, 8.13, 8.14 respectively, as they might be displayed on an oscilloscope. It can be seen that the sudden variations in current, indicative of the appearance of an electric discharge, are offset in time, depending on which current sensor 8.11, 8.12, 8.13, 8.14 is taken into consideration. Furthermore, the sudden variations are not all of the same amplitude.

In FIG. 1C, it is the sensor 8.13 that is the first to deliver a sudden variation in current representative of an electric discharge. This sudden variation in current has the greatest amplitude. The sensors 8.12 and 8.14 detect the partial discharge later, and the sudden variations in current that they deliver are of smaller amplitude. The signals S2, S4 delivered by the current sensors 8.12 and 8.14 are more distorted. It can be deduced therefrom that the detected electric discharge is located within the housing 3 and in the proximity of the grounding line 6.13, i.e. the grounding line that is surrounded by the current sensor 8.13 that was the first to detect the variation in current representative of the appearance of the electric discharge. In other words, the electric discharge is located in the compartment 3.3 or 3.4. Since the signal S2 is delayed a little relative to the signal S4, it is most likely that the discharge is located in the compartment 3.4 as it is very close to the current sensor 8.13. Nevertheless, it is preferable to open both compartments 3.3 and 3.4.

As with conventional methods of measuring electric discharges, the type of fault that led to the electric discharge can be determined by analyzing the shape of the signal S3 delivered by the current sensor 8.13 that was the first to detect the electric discharge. The analysis takes account of the instantaneous voltage at the beginning and at the end of the phenomenon representative of the electric discharge, and of the influence of the polarity and the frequency band covered by the signal segment that is analyzed. This type of analysis is conventional for a person skilled in the art using a device for detecting and locating at least one electric discharge, which is why it is not described in greater detail herein. The analysis means are referenced 10. It is thus possible to determine whether the discharge is a partial discharge, a corona effect discharge, a non-maintained disruptive discharge, or some other kind of discharge.

Figure 2A:
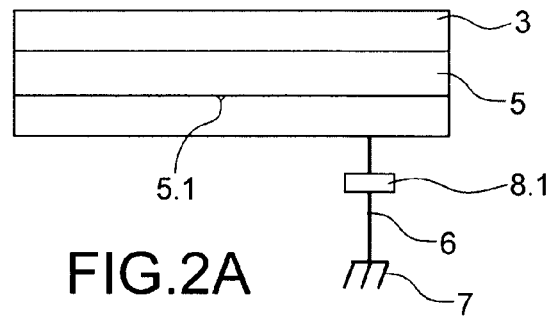
FIG. 2A shows apparatus used for testing the device of the invention for detecting and locating at least one electric discharge.
Figure 2B:
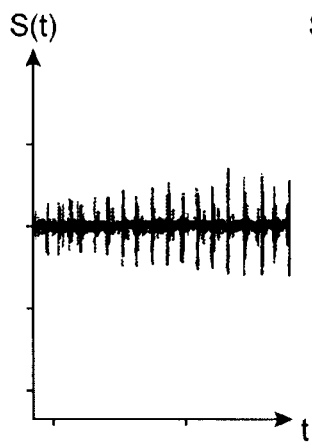
FIGS. 2B, 2C show, at different scales, a signal delivered by the FIG. 2A current detector before the appearance of an electric discharge.
Figure 2C:
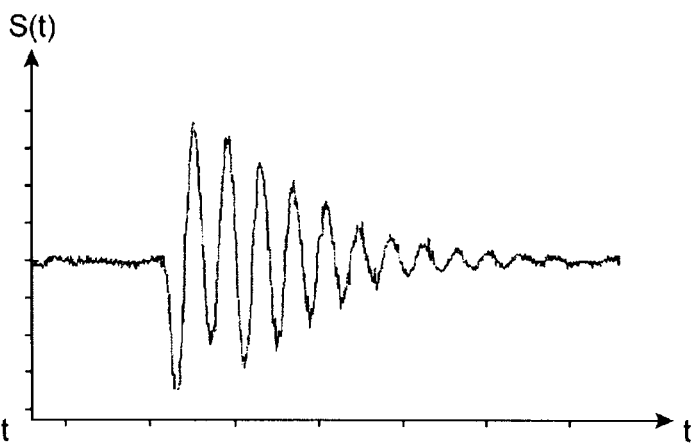

FIG. 2A shows a Rogowski coil 8.1 placed around a grounding line 6 of housing 3 containing a conductor element 5 that may be a bar. During a dielectric test seeking to demonstrate the advantage of the device of the invention for detecting and locating at least one electric discharge, the signals delivered by the current sensor 8.1 were recorded prior to the appearance of the partial discharge. The recordings of FIGS. 2B and 2C, at different scales, show the signals S(t) as delivered by the current sensor 8.1 in the instants preceding the dielectric breakdown, said breakdown leading to a partial discharge between the bar 5 and the housing 3. A sharp point referenced 5.1 is very likely at the origin of the partial discharge.

The supplier Kema makes available software for processing and analyzing signals delivered by sensors in the stator of an alternator for the purpose of locating therein at least one electric discharge, and even of determining the nature of the discharge. That software is entirely adapted to the intended application of detecting and locating electric discharges. Patent application WO 2004/051291 describes a method implemented by that software. The method is therefore not described in greater detail herein. It can be used for automatically detecting and locating an electric discharge in the electrical equipment.

It is possible to use Rogowski coils 8.1 that are suitable for being opened in order to perform the measurements. They are not difficult to install around ground-return lines without it being necessary to disconnect the grounding lines. To obtain a signal of good quality, it is important for the coil to be closed at the time the measurement is taken. Such Rogowski coils are generally wound in air. Such Rogowski coils are shown in FIG. 1A.

Figure 3A:
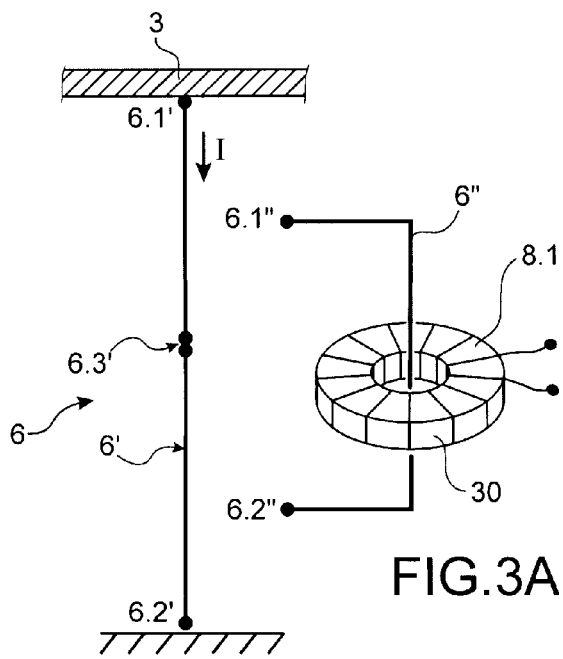
FIGS. 3A, 3B, 3C show a current sensor being installed around a secondary grounding line segment and connected to the main grounding line segment.
Figure 3B:
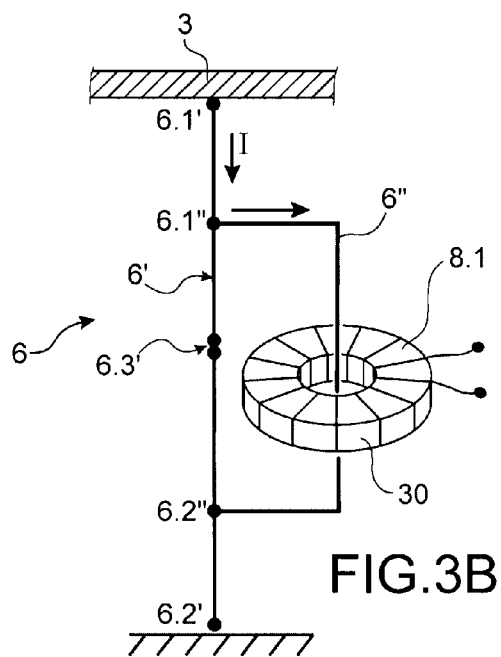
Figure 3C:
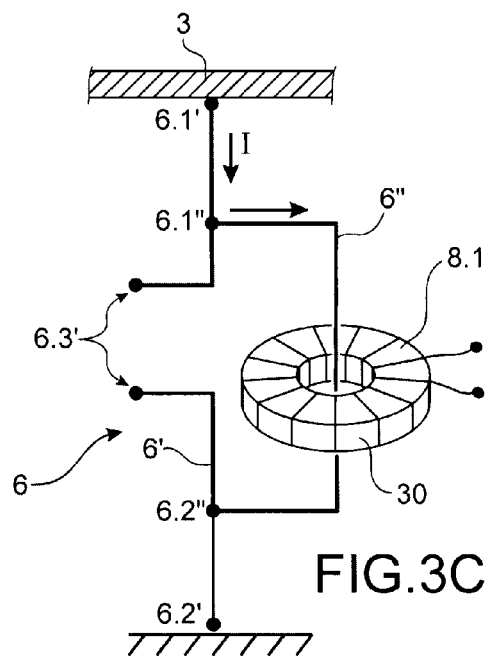

However, if the only Rogowski coils that are available are closed, for example coils wound on non-magnetic cores 30 that are substantially in the form of closed rings, then measurement can still be performed without it being necessary to interrupt the electrical connection between the housing 3 and ground 7. Reference is made to FIGS. 3A, 3B, 3C. It suffices to place a secondary grounding line segment 6" in addition to the main segment of the grounding line 6' that conventionally connects the housing 3 to ground 7. The ends of the main grounding line 6' are referenced 6.1' and 6.2'. It is these two segments together that form the grounding line 6. Under such circumstances, the grounding line 6 comprises the grounding line segment 6' that is referred to as the main grounding line segment 6' and that is associated with the secondary grounding line segment 6". The secondary grounding line segment 6" is fitted onto the main grounding line segment 6'. The Rogowski coil 8.1 is engaged around the secondary grounding line 6" before it is connected via its ends 6.1" and 6.2" to the main grounding line segment 6'. The main grounding line segment may include a separable connection 6.3' situated between its two ends 6.1' and 6.2'. The ends 6.1", 6.2" of the secondary segment 6" are secured to the main grounding line segment 6' on either side of the separable connection 6.3'. Current is shared between the main grounding line segment 6' and the secondary grounding line segment 6", and it is the fraction of the current flowing through the secondary grounding line segment 6" that is measured (FIG. 3B).

If it is preferred for the measurement to involve current of greater magnitude, it is possible to open the main grounding line segment 6' via its separable connection 6.3' so that all of the current flows via the secondary grounding line segment 6". The Rogowski coil will then measure all of the current flowing in the grounding line and not only a fraction thereof.

One advantage of using current sensors placed outside the housing is that they can be used with any electrical equipment even while it is in operation, since the method employed is not intrusive. In electrical equipment concerned by the invention, grounding lines are numerous and easily accessible, whereas in the prior art, external detectors needed to be placed at a smaller number of special locations that are not necessarily accessible, locations where an electric field radiates out from the housing, e.g. looking into inspection ports or at a connection between successive compartments.

The device and the method of the invention guarantee safety for the operator carrying out the measurements, since the Rogowski coils are isolated from the electrical equipment under test.

The use of Rogowski coils makes it possible to achieve a high level of noise elimination because it is the entire magnetic field around the grounding line that is detected.

Although various embodiments of the present invention are shown and described in detail, it will be understood that various changes and modifications can also be provided without going beyond the ambit of the invention.

The invention claimed is:

1. A device for detecting and locating at least one electric discharge in electrical equipment insulated by fluid contained in an electrically-conductive housing, the electrical equipment including a plurality of grounding lines located outside the electrically-conductive housing, said grounding lines being connected between the housing and ground and distributed along the housing, the device comprising:
   a plurality of current detectors of Rogowski coil type; and
   means for synchronously comparing signals delivered by the current detectors to locate the electric discharge;
   wherein the coil of each of the detectors is placed outside the electrically-conductive housing and around a respective one of the grounding lines connected between the housing and ground, each detector delivering a signal representative of current flowing in the grounding line, occurrence of an electric discharge giving rise to a sudden variation of the current, the electric discharge being located within a zone inside the housing and situated in proximity of the grounding line that is surrounded by the current detector that was first to deliver the sudden variation representative of the electric discharge.

2. A detection and locating device according to claim 1, in which the coil of a detector is a coil substantially in a form of a ring that can be opened so as to be placed around a grounding line without it being necessary to disconnect one of ends of the grounding line.

3. A detection and locating device according to claim 1, in which the coil of a detector is a coil substantially in a form of a closed ring, the grounding line comprising a main grounding line segment connected to the housing and to ground, and a secondary grounding line segment connected at a first end and a second end in parallel with the main grounding segment, the detector coil being thr adcd placed around the secondary grounding line segment.

4. A detection and locating device according to claim 3, in which the main grounding line segment is electrically continuous between the first end and the second end of the secondary grounding line segment.

5. A detection and locating device according to claim 3, in which the main grounding line segment is electrically discontinuous between the first end and the second end of the secondary grounding line segment.

6. A detection and locating device according to claim 1, further comprising:
   processor means for processing signals delivered by the current detectors to distinguish a type of electric discharge from amongst a partial discharge, a corona effect discharge, and a non-maintained disruptive discharge.

7. A detection and locating device according to claim 1, in which the signals delivered by the current detectors are integrated.

8. A fluid-insulated electrical equipment, comprising a device according to claim 1 for detecting and locating at least one electric discharge.

9. An electrical equipment according to claim 8, which is a metal-housing high voltage electricity unit or gas-insulated switch gear or control gear.

10. A method of detecting and locating at least one electric discharge in electrical equipment insulated by fluid contained in an electrically-conductive housing, the electrical equipment including a plurality of grounding lines located outside the electrically-conductive housing, said grounding lines being connected between the housing and ground, and distributed along the housing, the method comprising:
   placing a plurality of current detectors of Rogowski coil type outside the electrically-conductive housing and around a respective one of the grounding lines connected between the housing and ground; and
   acquiring and comparing signals delivered by each of the current detectors synchronously, with occurrence of an electric discharge giving rise to a sudden variation in the current, and an electric discharge is located as within a zone inside the housing situated in proximity of the grounding line that is surrounded by the current detector that was first to deliver the sudden variation representative of the electric discharge.

11. A method according to claim 10 for detecting and locating at least one electric discharge, in which the Rogowski coil is substantially in a form of a ring suitable for being opened is placed around a grounding line.

12. A method according to claim 10 for detecting and locating at least one electric discharge, in which the grounding line comprises both a main grounding line segment connected to the housing and to ground, and a secondary grounding line segment, and in which the Rogowski coil is engaged around the secondary grounding line segment, the coil being substantially in a form of a closed ring, and the secondary grounding line segment being connected at a first end and a second end in parallel with the main grounding line segment.

13. A method according to claim 12 for detecting and locating at least one electric discharge, in which the main grounding line segment between the first end and the second end of the secondary grounding line segment is opened.

14. A method according to claim 10 for detecting and locating at least one electric discharge, in which the signals delivered by a current detector that was the first to deliver a signal representative of an electric discharge is analyzed to determine a type of the electric discharge that has occurred.

15. A detection and locating device according to claim 1, wherein the means for synchronously comparing signals includes a comparator.

16. A detection and locating device according to claim 1, wherein the housing includes a plurality of compartments, one of the plurality of ground lines extends from each of the plurality of compartments of the housing to ground, and one of the plurality of current detectors of Rogowski coil type is placed around each one of the grounding lines connected between the housing and ground.

17. A detection and locating device according to claim 16, wherein there is no electrical insulation between two successive compartments of the plurality of compartments of the housing.

* * * * *